United States Patent [19]

Kiso et al.

[11] Patent Number: 5,757,809
[45] Date of Patent: May 26, 1998

[54] SEMICONDUCTOR MEMORY DEVICE

[75] Inventors: Hiroshi Kiso; Hidekazu Takata, both of Nara, Japan

[73] Assignee: Sharp Kabushiki Kaisha, Osaka, Japan

[21] Appl. No.: 827,038

[22] Filed: Mar. 25, 1997

[30] Foreign Application Priority Data

Jul. 31, 1996 [JP] Japan .................... 8-201454

[51] Int. Cl.$^6$ .................................... G06F 11/00
[52] U.S. Cl. .................................... 371/21.1
[58] Field of Search .................... 371/21.1, 21.2, 371/21.3; 365/189.01, 189.03, 230.01, 230.03

[56] References Cited

U.S. PATENT DOCUMENTS 5,617,369  4/1997  Tomishima et al. ................ 365/230
5,652,723  7/1997  Dosaka et al. ..................... 365/189

*Primary Examiner*—Vincent P. Canney
*Attorney, Agent, or Firm*—Morrison & Foerster, LLP

[57] ABSTRACT

A semiconductor memory device includes: a plurality of sectioned memory arrays; a comparing circuit; and a predetermined terminal, and configured so that the test mode, the same test data is written in simultaneously into a plurality of memory arrays, and when the written data is read out, the data is read out simultaneously from a plurality of memory arrays so that the comparing circuit compares the simultaneously read-out data outputs, if the result of the comparison shows agreement, the data itself is outputted through the predetermined terminal, while if the result of the comparison shows disagreement, the predetermined terminal is set into a high-impedance state, or the predetermined terminal is made to output a particular voltage other than the voltages representing the '1' level and the '0' level.

3 Claims, 7 Drawing Sheets

SEMICONDUCTOR MEMORY DEVICE

BACKGROUND OF THE INVENTION

1. Field of the Invention

The present invention relates to a method for testing a semiconductor memory device having a plurality of sectioned memory arrays.

2. Description of the Prior Art

FIG. 1 shows the prior art. Designated at M1 to M4 are memory cell array portions, sectioned into four, namely, the first to fourth memory cell array portions. Each of the memory cell array portions is composed of a memory cell array body MA, a row-decoder RD and a sense amplifier SA. The first and second memory cell array portions M1 and M2 share a column-decoder CD1; the third and fourth memory cell array portions M3 and M4 share a column-decoder CD2. Here, only one of memory cell array portions M1 through M4 is activated at a time (during the normal access mode). Designated at B1 through B4 are the first through fourth input/output buffers connected to corresponding memory cell array portions M1 to M4. D1 designates the first input/output data line; D2 the second input/output data line. The first to forth input/output buffers B1 to B4 are sectioned into two parts for the pair of these input/output data lines and connected thereto. Specifically, the first and second input/output buffers B1 and B2 are connected to the first input/output data line D1 through respective transfer gates T1 and T2; the third and fourth input/output buffers B3 and B4 are connected to the second input/output data line D2 through respective transfer gates T3 and T4. A data input buffer $B_{in}$ is connected to the first input/output data line D1 through a transfer gate T5 and is connected to the second input/output data line D2 through a transfer gate T6. The first input/output data line D1 and the second input/output data line D2 are connected to a data output buffer $B_{out}$ via respective transfer gates T7 and T8. Further, a test pattern generating circuit PG, a pattern comparing circuit C, judging circuit J are formed on the semiconductor memory chip. Test pattern generating circuit PG is connected to the pair input/output lines D1 and D2. Further, these pair input/output lines D1 and D2 are connected with pattern comparing circuit C, which in turn is connected to judging circuit J. Pattern comparing circuit C can be configured as shown in FIG. 2, for example. TM designates a timing generating circuit for determining the operation timing of each circuit.

Now, the test operation in the above semiconductor memory device will be described.

The test starts by writing the same test pattern data in parallel into a plurality of memory cell arrays. That is, the test pattern outputted from the test pattern generating circuit PG is written into the memory cell array portions which are being activated at the same time by corresponding sensor amplifiers. In this case, the transfer gates corresponding to the memory cell array portions open while address signals are sequentially generated by the combination of the row-address counter (not shown) and the column-address counter (not shown) so as to operate the address decoders (the aforementioned row-decoders and column-decoders). During this operation, for each address, the same row and the same column are selected for memory cell array portions M1 and M3 so as to select corresponding memory cells at the same location in respective memory cell array portions. Similarly, for memory cell array portions M2 and M4, corresponding transfer gates T2 and T4 are opened while memory cells are sequentially selected so as to write the test pattern therein. Thus, the write operation of the test pattern data for all the memory cells is completed.

During the test, based on the address signal output from the address counter, addresses corresponding to two memory cell array portions M1(M2) and M3(M4) should be simultaneously selected. In order to achieve this, for example, suppose that the memory device operates so that memory cell array portion M1 (M2) is selected when the address signal $A_O$=L whereas memory cell array portion M3 (M4) is selected when the address signal $A_O$=H. If so, a two-input AND gate is interposed into each of the address signal lines for $A_O$ and NOT $A_O$ between the address counter and the address decoder while a control signal H or L is applied to the other input depending upon whether the operation is in the normal access mode or in the test mode. This configuration allows, in the test mode, two memory cell array portions to be selected at the same time in accordance with a single address signal outputted from the address counter.

Next, address signals are sequentially generated, and the memory cells at the same location in memory cell array portions M1 and M3 are selected for each address. In this case, both the sense amplifiers for memory cell array portions M1 and M3 are activated simultaneously so as to open transfer gates T1 and T3 corresponding to memory cell array portions M1 and M3. Thus, the readings of data from these memory cell array portions are transmitted to input/output data lines D1 and D2 through respective input/output buffers B1 and B3 and through transfer gates T1 and T3. Then, pattern comparing circuit C checks whether these two values of data on the pair of input/output lines agree or disagree. If the result of the comparison shows agreement, the device is judged as normal; if the result of the comparison shows disagreement, there are some defects. Judging circuit J, if it receives a signal representing disagreement from pattern comparing circuit C, will latch this and produce an error judgment output. Subsequently, a similar process is carried out for the remaining memory cell array portions, i.e., M2 and M4.

In performing normal operation of the above memory, transfer gates T5 and T6 located between data input buffer $B_{in}$ and input/output data line D1, D2, and transfer gates T7 and T8 located between data output buffer $B_{out}$ and input/output data line D1, D2, are all kept open, so as to allow the data reading or writing to be performed for memory cells selected inside a selected memory cell array portion.

As a semiconductor memory device increases in its memory capacity, the time for testing becomes longer, becoming troublesome. Methods for reducing the testing time have been devised. One conventional technique for reducing the time for testing, includes the following steps of: writing the same data into a plurality of memory arrays; reading out the written data simultaneously; outputting the result of the comparison, i.e., agreement or disagreement between this data, through a specially provided output pin to judge the memory device. This method is used to reduce the size of addresses so as to realize a reduction of the testing time. In this conventional technique, however, if two pieces of data to be compared to each other become erroneous simultaneously, the result is still judged as to be in agreement. Accordingly, to pick out all the faulty products, all the devices whose data outputs have been determined as to be in agreement must be checked again by the normal test (a test for checking all the memory locations one by one). That is, this method has a reduced effect on reducing the testing time. If this rechecking process is omitted, the reliability lowers, though it still has some effect on reducing the testing time.

To sum up, the problems are listed as follows:

(1) In the prior art, when two pieces of data to be compared to each other have the same error, the result of the comparison will be judged to be in agreement, and thus these devices will be determined as normal. Therefore, if reliability should be a priority, the effect of reducing the testing time lowers. In contrast, if the reduction of the testing time should be a priority, the reliability lowers.

(2) In the prior art, an output pin for judgment, i.e., either agreement or disagreement, must be provided for the packaged product.

SUMMARY OF THE INVENTION

It is therefore an object of the present invention to provide a semiconductor memory device wherein if the result of a comparison between the simultaneously read-out data outputs shows agreement, the data itself is outputted through a predetermined terminal, while if the result of the comparison between the simultaneously read-out data outputs shows disagreement, the predetermined terminal is set into a state which can be distinguished from the output states of data '1' and '0' (i.e., the terminal is set into a high-impedance state or the terminal is made to output a particular voltage distinct from the voltage representing the '1' level or the '0' level).

The present invention has been achieved to attain the above object, the gist of the invention is as follows:

In accordance with the first aspect of the invention, a semiconductor memory device, comprises: a plurality of sectioned memory arrays; a comparing circuit; and a predetermined terminal, and is characterized in that in the test mode, the same test data is written in simultaneously into a plurality of memory arrays, and when the written data is read out, the data is read out simultaneously from a plurality of memory arrays so that the comparing circuit compares the simultaneously read-out data outputs, if the result of the comparison between the simultaneously read-out data outputs shows agreement, the data itself is outputted through the predetermined terminal, while if the result of the comparison between the simultaneously read-out data outputs shows disagreement, the predetermined terminal is set into a high-impedance state, or the predetermined terminal is made to output a particular voltage other than the voltages representing the '1' level and the '0' level.

Next, according to the second aspect of the invention, a semiconductor memory device having the above first feature is characterized in that the predetermined terminal is a data output terminal.

Further, according to the third aspect of the invention, a semiconductor memory device having the above first feature is characterized in that the predetermined terminal is a data input/output terminal.

From the result of the comparison of the data outputs read out from a plurality of memory arrays, if the comparison shows agreement, the data itself is outputted through the data output terminal, whereas if the comparison shows disagreement, the data will not be outputted. In this case, the potential of the output terminal becomes equal to the terminal voltage of the memory tester, not reaching the judgment potential of the memory tester, so that the memory tester determines the device as faulty. Alternatively, if the comparison shows agreement, the data itself is outputted through the data output terminal, whereas if the comparison shows disagreement, the data output terminal outputs a voltage (for instance, the medium voltage between an output judgment voltage VOH representing the '1' level and an output judgment voltage VOL representing the '0' level) which causes the memory tester to determine that the output from the device is different from the expected values of the memory tester, i.e., '1' and '0'. Also in this case, the memory tester determines the device as faulty.

In the prior art, if the data outputs to be compared to each other are equal but they are both erroneous, it was impossible to determine the device as faulty. However, since in accordance with the invention, the raw data itself is outputted to be compared with the expected value of the memory tester, the comparison can show disagreement even in the above case, thus it is possible to properly determine such a device as faulty. If the data to be compared inside the memory shows disagreement, the potential level of the output terminal does not reach the output judgment voltage of the memory tester. Therefore, the memory tester judges that it is not equal to the expected value, thus properly determining this device as faulty. No special terminal for outputting agreement or disagreement is necessary.

In this way, even when the data outputs to be compared to each other give the same erroneous result, it is possible to determine anomaly in the device. Hence the reliability of the test can be improved in addition to reducing the testing time.

DESCRIPTION OF THE PREFERRED EMBODIMENTS

Figure 1:
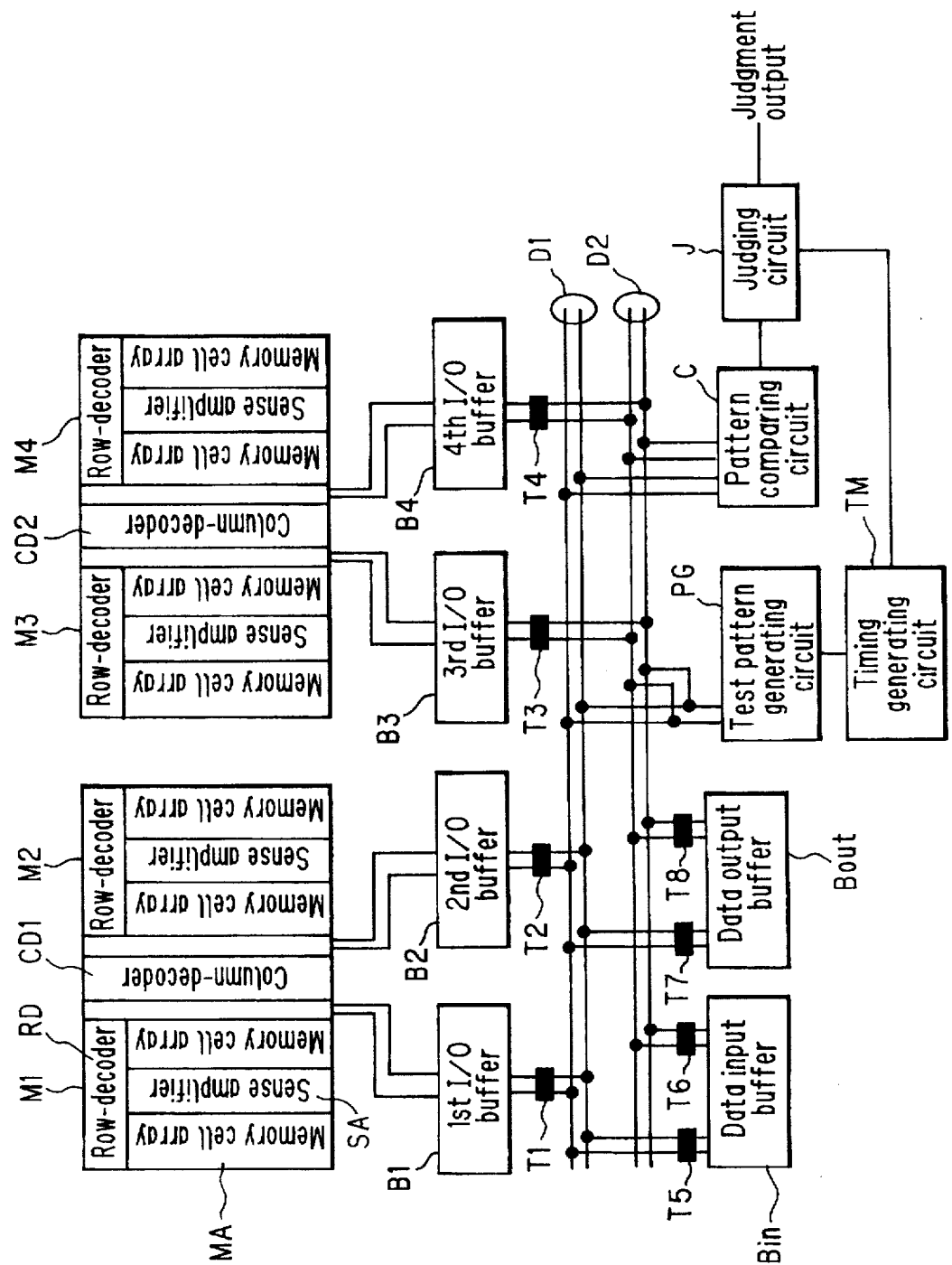
FIG. 1 is a block diagram showing a conventional semiconductor memory device.
Figure 2:
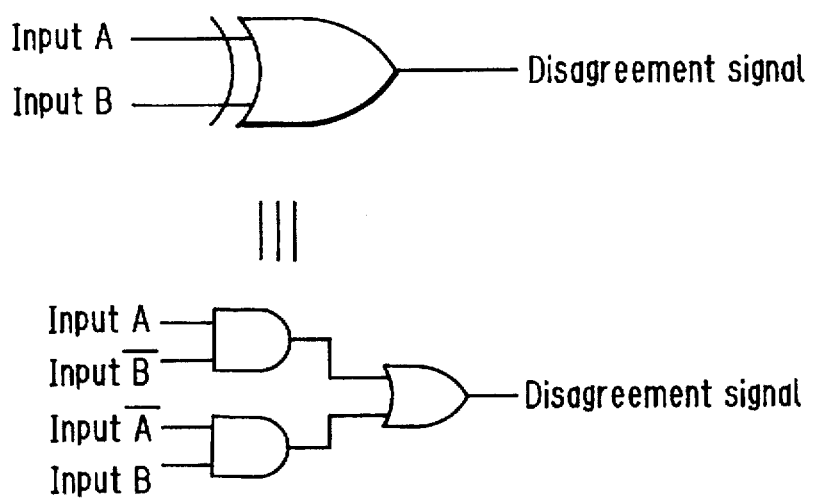
FIG. 2 is a diagram showing a pattern comparing circuit.
Figure 3:
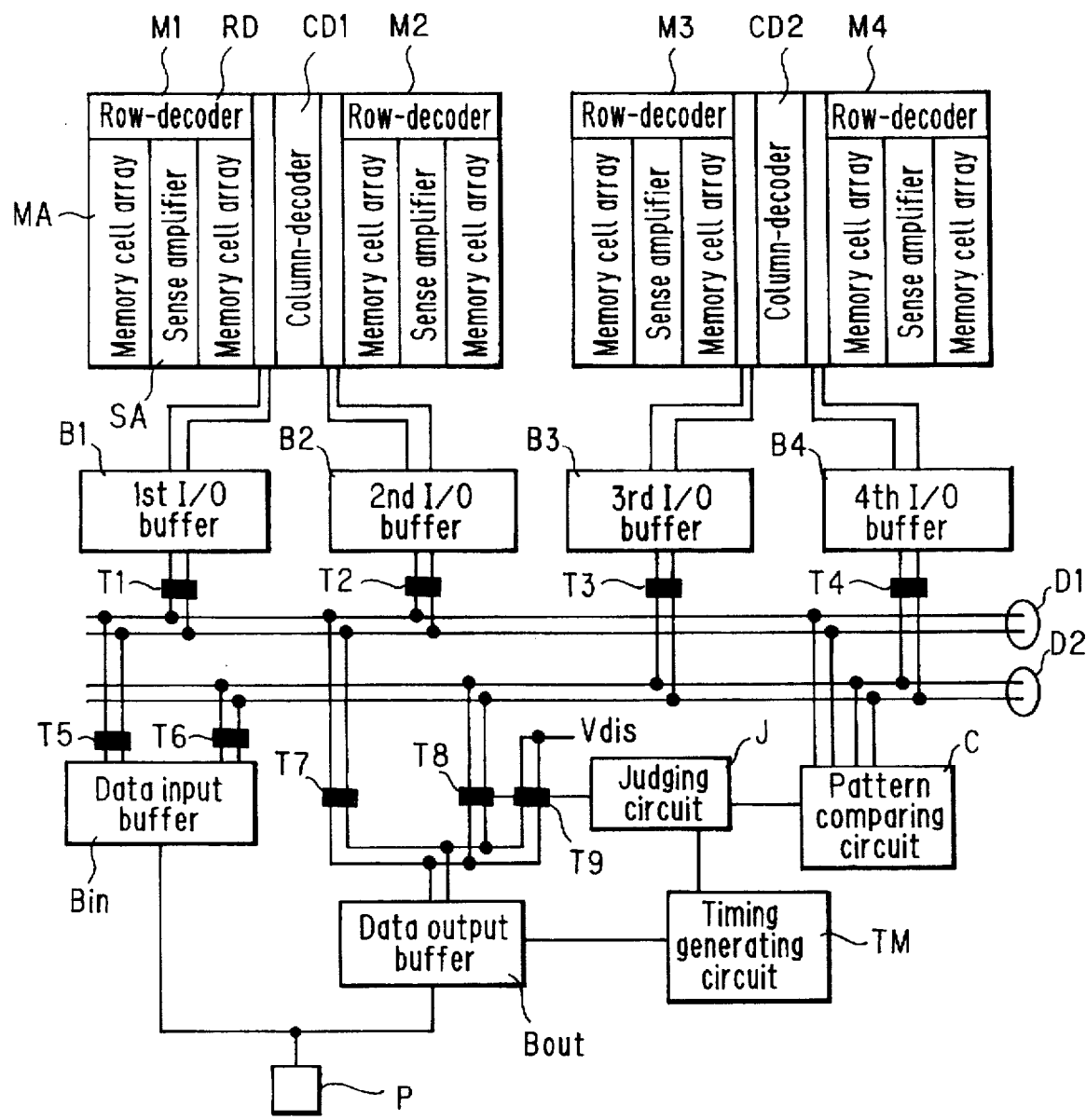
FIG. 3 is a block diagram showing the first embodiment of the invention.

FIG. 3 shows an embodiment of the invention. In this embodiment, the invention is applied to RAM.

Figure 4:
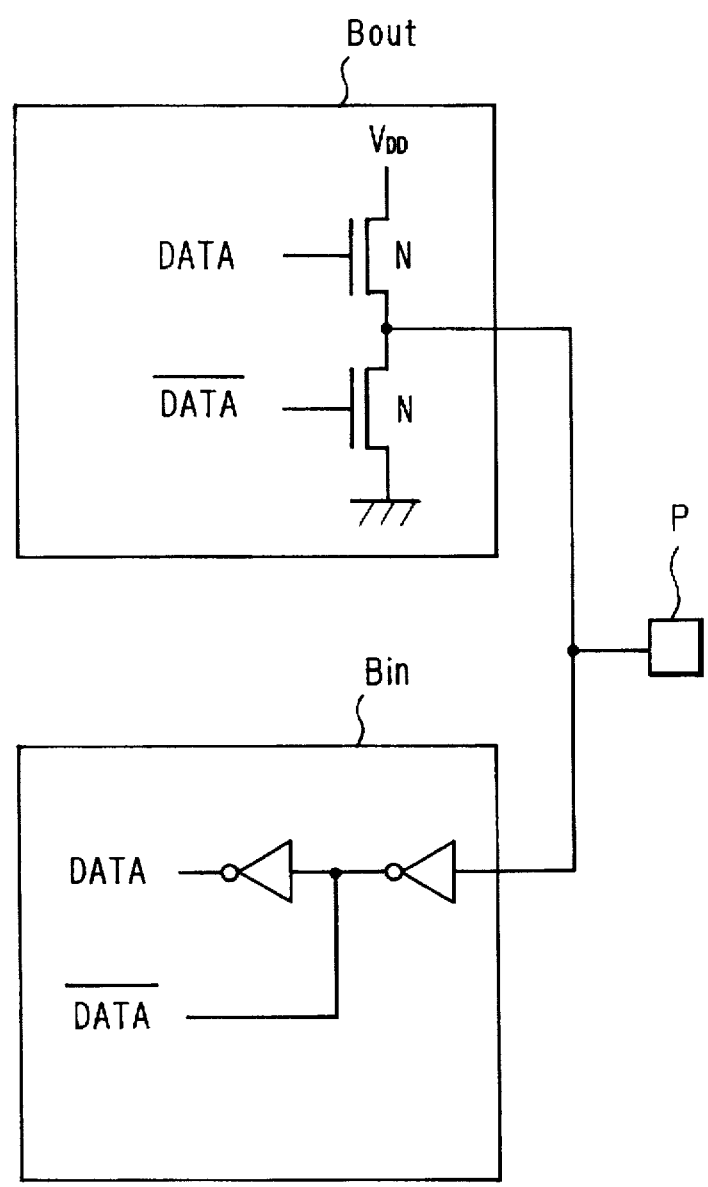
FIG. 4 is a block diagram showing a data input buffer and a data output buffer.

Designated at M1 to M4 are memory cell array portions, sectioned into four, namely, the first to fourth memory cell array portions. Each of the memory cell array portions is composed of a memory cell array body MA, a row-decoder RD and a sense amplifier SA. The first and second memory cell array portions M1 and M2 share a column-decoder CD1; the third and fourth memory cell array portions M3 and M4 share a column-decoder CD2. Here, only one of memory cell array portions M1 through M4 is activated at a time (during the normal access mode). Designated at B1 through B4 are the first through fourth input/output buffers connected to corresponding memory cell array portions M1 to M4. D1 designates the first input/output data line; D2 the second input/output data line. The first to forth input/output buffers B1 to B4 are sectioned into two parts for the pair of these input/output data lines and connected thereto. Specifically, the first and second input/output buffers B1 and B2 are connected to the first input/output data line D1 through respective transfer gates T1 and T2; the third and fourth input/output buffers B3 and B4 are connected to the second input/output data line D2 through respective transfer gates T3 and T4. A data input buffer $B_{in}$ is connected to the first input/output data line D1 through a transfer gate T5 and is connected to the second input/output data line D2 through a transfer gate T6. The first input/output data line D1 and the second input/output data line D2 are connected to a data output buffer $B_{out}$ via respective transfer gates T7 and T8. A line for applying a bias voltage $V_{dis}$ which keeps data output buffer $B_{out}$ deactivated (for example, suppose that a pair of data lines for transmitting the data to be inputted to data output buffer $B_{out}$ are pre-charged at 0 and $B_{out}$ is activated if one of them is changed to 1. $V_{dis}$ is forced to 0) is connected to data output buffer $B_{out}$ via transfer gate T9. Data input buffer $B_{in}$ and data output buffer $B_{out}$ are connected commonly to an input/output terminal (pad) P which is used for both the data input and output, as shown in the figure. Here, the diagram illustrates a single bit only. FIG. 4 shows an example of the configuration of data input buffer $B_{in}$ and data output buffer $B_{out}$.

Further, a pattern comparing circuit C, judging circuit J are formed on the semiconductor memory chip. The aforementioned pair input/output lines D1 and D2 are connected with pattern comparing circuit C, which in turn is connected to judging circuit J. Here, TM designates a timing generating circuit for determining the operation timing of judging circuit J and data output buffer $B_{out}$. If this semiconductor memory device is a synchronous type with an external clock, this timing may be generated from the external clock.

The test operation in the above semiconductor memory device will be described.

This test is implemented after the completion of the product and before shipment. In this case, the products which have been determined as good will be shipped and those determined as faulty will be discarded.

In the case where a test is carried out for reprocessing, the test is implemented after a plurality of memory IC chips have been built on the semiconductor wafer and before the wafer is cut into chips. For a chip which has been determined as faulty, if it can be recovered by reprocessing, this will be implemented. If reprocessing can be performed after packaging, the test may be implemented after packaging.

As described above, the present invention can be applied to two kinds of tests.

The device is configured so that it enters the test mode when, for example, a much higher voltage than the power supply voltage is applied to a predetermined address terminal (not shown). Then, identical test pattern data is written in parallel for a plurality of memory cell arrays, from an external memory tester via input/output pad P and data input buffer B in. In this case, for memory cell array portions M1 and M3, corresponding transfer gates T1 and T3 are made to open. At this moment, for each address, the same row and the same column are selected for memory cell array portions M1 and M3 so as to select corresponding memory cells at the same location in respective memory cell array portions. Similarly, for memory cell array portions M2 and M4, corresponding transfer gates T2 and T4 are opened while memory cells are sequentially selected so as to write the test pattern therein. Thus, the write operation of the test pattern data for all the memory cells is completed.

During the test, address signals are sequentially inputted from the external memory tester. For a single address signal to be used for selecting respective locations in two memory cell array portions M1(M2) and M3(M4), a similar method to the conventional one can be used.

Then, the memory cells at the same location in memory cell array portions M1 and M3 are selected for each address. In this case, both the sense amplifiers for memory cell array portions M1 and M3 are activated simultaneously so as to open transfer gates T1 and T3 corresponding to memory cell array portions. Thus, the readings of data from these memory cell array portions are transmitted to input/output data lines D1 and D2 through respective input/output buffers B1 and B3 and through transfer gates T1 and T3. Then, pattern comparing circuit C checks whether these two pieces of data on the pair of input/output lines agree or disagree. Judging circuit J, if it receives a signal representing disagreement from pattern comparing circuit C, will open transfer gate T9 and close transfer gate T8 in accordance with the control timing from the timing generating circuit TM. This deactivates data output buffer $B_{out}$ or changes it into a high-impedance state where no data can be outputted, and therefore the state disagrees with the expected value from the external memory tester, thus, error determination is achieved. If two pieces of data to be compared to each other become erroneous simultaneously, the output from comparing circuit C shows agreement, and judging circuit J opens transfer gate T8 and closes transfer gate T9 so that the data is outputted from data output buffer $B_{out}$. However, since this data does not coincide with the expected value from the external memory tester, error determination is achieved. Subsequently, a similar process is carried out for the remaining memory cell array portions, i.e., M2 and M4.

In the above test, if the data outputs result in disagreement, or the memory is determined to contain some error. In such a case the memory is checked for individual addresses, to locate faulty memory locations. Then, reprocessing will be carried out (in the case of the test aimed at reprocessing).

In performing normal operation of the above memory, transfer gates T5 and T6 located between data input buffer $B_{in}$ and input/output data line D1, D2, and transfer gates T7 and T8 located between data output buffer $B_{out}$ and input/output data line D1, D2 are kept open with transfer gate T9 closed, so as to allow the data read or write operation to be performed for memory cells selected inside a selected memory cell array portion.

Figure 5:
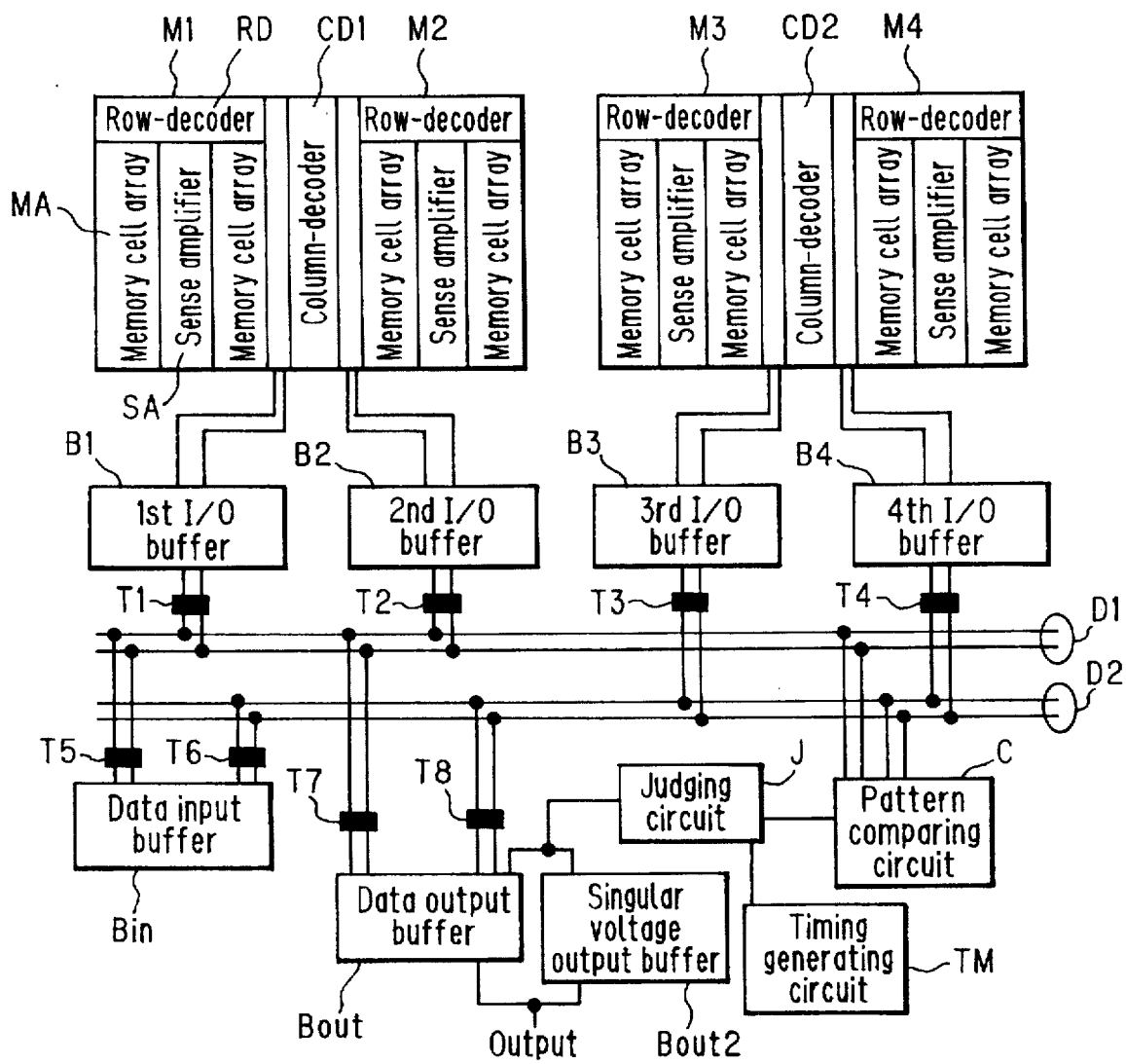
FIG. 5 is a block diagram showing the second embodiment of the invention.

FIG. 5 shows another embodiment of the invention. In this embodiment, the invention is applied to RAM.

Designated at M1 to M4 are memory cell array portions, sectioned in four, namely, the first to fourth memory cell array portions. Each of the memory cell array portions is composed of a memory cell array body MA, a row-decoder RD and a sense amplifier SA. The first and second memory cell array portions M1 and M2 share a column-decoder CD1; the third and fourth memory cell array portions M3 and M4 share a column-decoder CD2. Here, only one of memory cell array portions M1 through M4 is activated at a time (during the normal access mode). Designated at B1 through B4 are the first through fourth input/output buffers connected to corresponding memory cell array portions M1 to M4. D1 designates the first input/output data line; D2 the second input/output data line. The first to forth input/output buffers B1 to B4 are sectioned into two parts for the pair of these input/output data lines and connected thereto. Specifically, the first and second input/output buffers B1 and B2 are connected to the first input/output data line D1 through respective transfer gates T1 and T2; the third and fourth input/output buffers B3 and B4 are connected to the second input/output data line D2 through respective transfer gates T3 and T4. A data input buffer $B_{in}$ is connected to the first input/output data line D1 through a transfer gate T5 and is connected to the second input/output data line D2 through a transfer gate T6. The first input/output data line D1 and the second input/output data line D2 are connected to a data output buffer $B_{out}$ via respective transfer gates T7 and T8. Further, provided is a singular voltage output buffer $B_{out2}$ which outputs a singular voltage, intermediate between an output judgment voltage VOH representing the '1' level and an output judgment voltage VOL representing the '0' level, in the external memory tester. Moreover, a pattern comparing circuit C, judging circuit J are formed on the semiconductor memory chip. The aforementioned pair input/output lines D1 and D2 are connected with pattern comparing circuit C, which in turn is connected to judging circuit J. Here, TM designates a timing generating circuit for determining the operation timing of judging circuit J and data output buffer $B_{out}$. If this semiconductor memory device is a synchronous type with an external clock, this timing may be generated from the external clock.

As shown in FIG. 5, based on the output from judging circuit J, the output is switched between the output from data output buffer $B_{out}$ and that from the singular voltage output buffer $B_{out2}$ which outputs a singular voltage (e.g., the middle value of the output judgment voltage VOH representing the '1' level and the output judgment voltage VOL representing the '0' level).

The test operation in the above semiconductor memory device will be illustrated.

This test is implemented after the completion of the product and before shipment. In this case, the products which have been determined as good will be shipped and those determined as faulty will be discarded.

In the case where a test is carried out aimed at reprocessing, the test is implemented after a plurality of memory IC chips have been built on the semiconductor wafer and before the wafer is cut into chips. For a chip which has been determined as faulty, if it can be recovered by reprocessing, this will be implemented. If reprocessing can be performed after packaging, the test may be implemented after packaging.

The test mode is activated, for example, when a much higher voltage than the power supply voltage is applied to a predetermined address terminal (not shown). Then, identical test pattern data is written in parallel into a plurality of memory cell arrays, from an external memory tester via input/output pad P and data input buffer $B_{in}$. In this case, for memory cell array portions M1 and M3, corresponding transfer gates T1 and T3 are made to open. At this moment, for each address, the same row and the same column are selected for memory cell array portions M1 and M3 so as to select corresponding memory cells at the same location in respective memory cell array portions. Similarly, for memory cell array portions M2 and M4, corresponding transfer gates T2 and T4 are opened while memory cells are sequentially selected so that the test pattern data can be written therein. Thus, the write operation of the test pattern data for all the memory cells is completed.

During the test, address signals are sequentially inputted from the external memory tester. For a single address signal to be used for selecting respective locations in two memory cell array portions M1(M2) and M3(M4), a similar method to the conventional one can be used.

Then, the memory cells at the same location in memory cell array portions M1 and M3 are selected for each address. In this case, both the sense amplifiers for memory cell array portions M1 and M3 are activated simultaneously so as to open transfer gates T1 and T3 corresponding to memory cell array portions. Thus, the readings of data from these memory cell array portions are transmitted to input/output data lines D1 and D2 through respective input/output buffers, B1 and B3 and through transfer gates T1 and T3. Then, pattern comparing circuit C checks whether these two pieces of data on the pair of input/output lines agree or disagree. When judging circuit J receives a signal representing disagreement from pattern comparing circuit C, the output from singular voltage output buffer $B_{out2}$ is selected to be outputted from the input/output pad (or an output pad). This value does not coincide with the expected value of the external memory tester, thus, error determination is achieved. If two pieces of data to be compared to each other become erroneous simultaneously, the output from comparing circuit C shows agreement, and the output from data output buffer $B_{out}$ is outputted. However, since this output does not coincide with the expected value from the external memory tester, error determination is achieved. Subsequently, a similar process is carried out for the remaining memory cell array portions, i.e., M2 and M4.

In performing normal operation of the above memory, transfer gates T5 and T6 located between data input buffer $B_{in}$ and input/output data line D1, D2, and transfer gates T7 and T8 located between data output buffer $B_{out}$ and input/output data line D1, D2 are kept open with transfer gate T9 closed, so as to allow the data read or write operation to be performed for memory cells selected inside a selected memory cell array portion.

In the above embodiments, the data input/output terminal is used (or the terminal dedicated for data output may be used) so that it will output the actual data when the comparison shows agreement and it will be set into a high-impedance state or be made to output a singular voltage when the comparison shows disagreement. However, a dedicated output terminal may be provided to achieve the above operation.

If the test is implemented in the final stage of the wafer process, even if the device has a dedicated output terminal (pad), it is possible to keep the interchangeability of the package which can be used for a device with no lead terminal for judgment output. That is, the dedicated pad may and should be configured not to be connected to the input/output terminals (lead terminals) of the package.

In all of the above embodiments, the present invention was applied to a normal semiconductor memory device in which only one of memory cell array portions M1 through M4 is activated at a time during the normal access mode. However, the present invention can be effective for a semiconductor memory device having bank structures in which memory arrays sectioned in plural can be activated individually.

Figure 6:
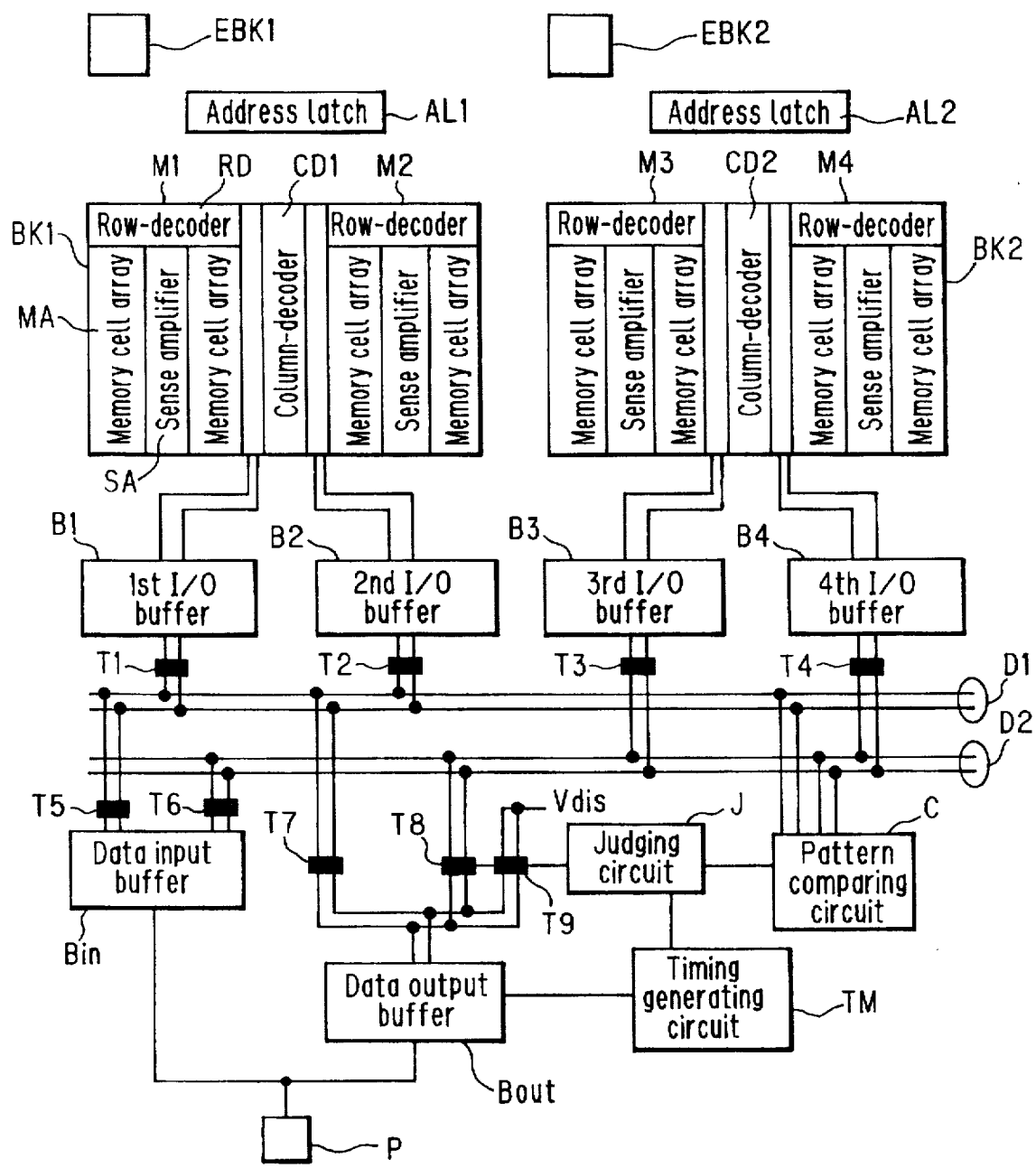
FIG. 6 is a block diagram showing the third embodiment of the invention.
Figure 7:
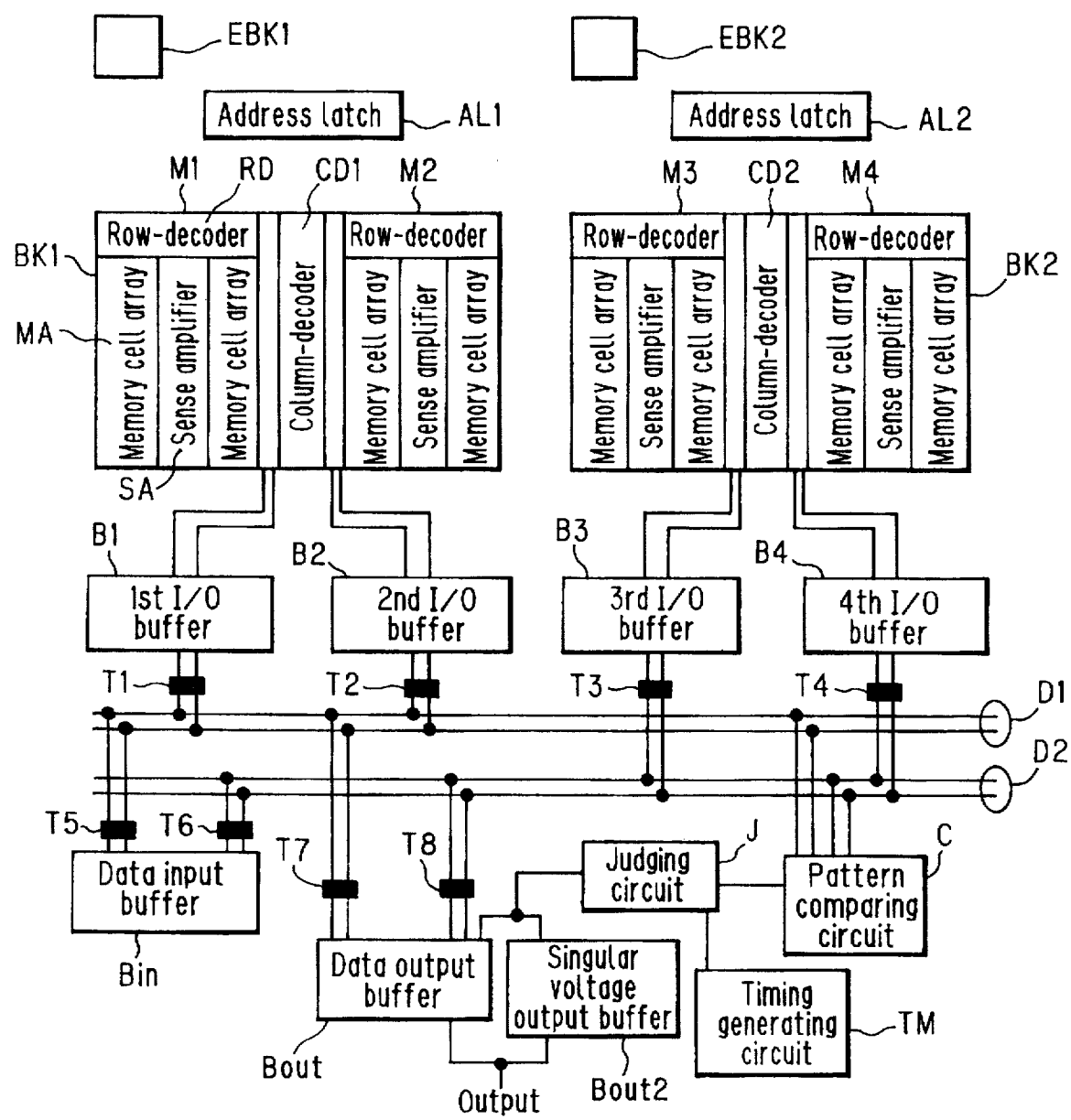
FIG. 7 is a block diagram showing the fourth embodiment of the invention.

FIGS. 6 and 7 are block diagrams showing the cases where the present invention is applied to a semiconductor memory device having bank structures. The configuration in FIG. 6 corresponds to that in FIG. 3 and the configuration in FIG. 7 corresponds to that in FIG. 5.

In FIGS. 6 and 7, memory cell array portions M1 and M2 and a column decoder CD1 constitute a first bank BK1, and memory cell array portions M3 and M4 and a column decoder CD2 constitute a second bank BK2. Banks BK1 and BK2 can be activated individually. That is, it is possible to activate only bank BK1 or BK2, or to activate both banks BK1 and BK2 simultaneously. Concerning the means for activating the banks individually, banks BK1 and BK2 have bank activation holding circuits EBK1 and EBK2 (which each have a flip-flop that will be set by the instructions for activation of the bank so as to make the bank active while the flip-flop is being set, and will be reset by the instructions for deactivation) and address latches AL1 and AL2, respectively, as shown in the figures. A typical method is effected by operating these circuits, independently. If bank activation holding circuit EBK1 is in the set state while EBK2 is in the reset state, bank BK1 alone will be activated. If bank activation holding circuit EBK2 is set while EBK2 is reset. Bank BK2 alone will be activated. If bank activation holding circuits EBK1 and EBK2 are both set, both banks will be activated.

During the test mode, by applying the output from bank activation holding circuit EBK1 for bank BK1 to bank BK2, or by setting both bank activation holding circuits EBK1 and EBK2, BK1 and BK2 are activated simultaneously, so that the data from the same address can be compared between the two banks and the comparison result can be outputted, in the same manner as in the above embodiments.

In accordance with the invention, it is possible to shorten the testing time by reducing the size of addresses to be accessed during the test mode. Further, even when the outputs of data which are from a plurality of memory arrays to be compared to each other produce the same faulty results so that the comparison shows agreement, it is possible to distinguish the device as faulty.

What is claimed is:

1. A semiconductor memory device, comprising: a plurality of sectioned memory arrays; a comparing circuit; and a predetermined terminal, characterized in that in the test mode, the same test data is written in simultaneously into a plurality of memory arrays, and when the written data is read out, the data is read out simultaneously from a plurality of memory arrays so that the comparing circuit compares the simultaneously read-out data outputs, if the result of the comparison between the simultaneously read-out data outputs shows agreement, the data itself is outputted through the predetermined terminal, while if the result of the comparison between the simultaneously read-out data outputs shows disagreement, the predetermined terminal is set into a high-impedance state, or the predetermined terminal is made to output a particular voltage other than the voltages representing the '1' level and the '0' level.

2. A semiconductor memory device according to claim 1, wherein the predetermined terminal is a data output terminal.

3. A semiconductor memory device according to claim 1, wherein the predetermined terminal is a data input/output terminal.

* * * * *